(12) United States Patent
Odajima

(10) Patent No.: US 7,987,076 B2
(45) Date of Patent: Jul. 26, 2011

(54) ELECTROMAGNETIC FIELD SIMULATOR AND ELECTROMAGNETIC FIELD SIMULATION PROGRAM STORAGE MEDIUM

(75) Inventor: Wataru Odajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1316 days.

(21) Appl. No.: 11/320,047

(22) Filed: Dec. 29, 2005

(65) Prior Publication Data

US 2007/0061123 A1    Mar. 15, 2007

(30) Foreign Application Priority Data

Sep. 9, 2005    (JP) ................... 2005-261851

(51) Int. Cl.
*G06G 7/48* (2006.01)
(52) U.S. Cl. .......................................... 703/5
(58) Field of Classification Search ................ 703/5
See application file for complete search history.

(56) References Cited

U.S. PATENT DOCUMENTS

| 2003/0139914 | A1 | 7/2003 | Yamagajo et al. ........... 703/5 |
| 2004/0204877 | A1* | 10/2004 | Yoshida et al. ........... 702/65 |
| 2005/0021321 | A1 | 1/2005 | Mochizuki et al. ........... 703/11 |

FOREIGN PATENT DOCUMENTS

| CA | 2255215 | 6/1999 |
| JP | 11-250120 | 9/1999 |
| JP | 2000-227450 | 8/2000 |
| JP | 2002-340954 | 11/2002 |
| JP | 2003-078326 | 3/2003 |
| JP | 2003-216681 | 7/2003 |
| JP | 2004-184301 | 7/2004 |
| JP | 2005-43219 | 2/2005 |
| JP | 2005-274233 | 10/2005 |
| WO | 2004/109560 | 12/2004 |

OTHER PUBLICATIONS

Dennis M. Sullivan, "Electromagnetic simulation using the FDTD method", 2000, Institute of Electrical and Electronic Engineers, pp. 1-20.*

Werner Thiel et al., "Some aspects of stability and numerical dissipation of the finite-difference time-domain (FDTD) technique including passive and active lumped elements", 2002, IEEE Transactions on Microwave Theory and Techniques, vol. 50, No. 9, pp. 2159-2165.*

(Continued)

*Primary Examiner* — Paul L Rodriguez
*Assistant Examiner* — Russ Guill
(74) *Attorney, Agent, or Firm* — Staas & Halsey LLP

(57) ABSTRACT

The electromagnetic field simulator includes a discrete model setting section which sets a space grid width and a time step in a simulation of the electromagnetic field, a coefficient setting section which sets coefficients of equations for the simulation at various positions in a simulation space based on electromagnetic physical properties, a wave source setting section which sets a position and amplitude of a wave source of the electromagnetic wave as a boundary condition with respect to a spatial distribution of the electromagnetic field, and an amplitude calculation section which calculates amplitude of an electromagnetic field component given to the position of the wave source in the simulation space based on the space grid width and the time step and the electromagnetic physical properties at the position of the wave source to reproduce the electromagnetic wave having the set position and amplitude of the wave source in simulation results.

2 Claims, 17 Drawing Sheets

OTHER PUBLICATIONS

Warren L. Stutzman et al. "Antenna theory and design", second edition, 1998, John Wiley and Sons, pp. 493-519.*

Allen Taflove et al., "Computational electrodynamics: the finite-difference time-domain method", second edition, 2000, Artech House, pp. 1-107, 156-163, 175-233.*

Burkay Donderici et al., "Symmetric source implementation for the ADI-FDTD method", Apr. 2005, IEEE Transactions on Antennas and Propagation, vol. 53, No. 4, pp. 1562-1565.*

Supriyo Dey et al., "A locally conformal finite-difference time-domain (FDTD) algorithm for modeling three-dimensional perfectly conducting objects", 1997, IEEE Microwave and Guided Wave Letters, vol. 7, No. 9, pp. 273-275.*

D.N.Buechler et al., "Modeling sources in the FDTD formulation and their use in quantifying source and boundary condition errors", 1995, IEEE Transactions on Microwave Theory and Techniques, vol. 43, No. 4, pp. 810-814.*

Riku M. Makinen et al., "A stabilized resistive voltage source for FDTD thin-wire models", 2003, IEEE Transactions on Antennas and Propagation, vol. 51, No. 7, pp. 1615-1622.*

Glen Rodriguez et al., "Electromagnetic field analysis using a parallel FDTD algorithm in extremely large areas for mobile communication", 2001, T.IEE Japan, vol. 121-C, No. 12, pp. 1826-1833.*

"Numerical Solution of Initial Boundary Value Problems Involving Maxwell's Equations in Isotropic Media", Kane S. Yee, IEEE Transactions on Antennas and Propagation, May 1966, pp. 302-307.

"Finite Difference Time Domain Method for Electromagnetic Field and Antenna Analyses", ISBN 4-339-00689-0, Mar. 20, 1998, Cover, Back Cover and pp. 1-33.

* cited by examiner

ELECTROMAGNETIC FIELD SIMULATOR AND ELECTROMAGNETIC FIELD SIMULATION PROGRAM STORAGE MEDIUM

BACKGROUND OF THE INVENTION

1. Field of the Invention

The present invention relates to an electromagnetic field simulator which simulates an electromagnetic field and an electromagnetic field simulation program storage medium which stores an electromagnetic field simulation program which causes a computer to simulate the electromagnetic field.

2. Description of the Related Art

An electromagnetic field simulator and electromagnetic field simulation program targeted for communication radio waves are conventionally known, which simulate an electromagnetic field to analyze performance of communication antennas. Furthermore, as a representative technique for simulating an electromagnetic field using such an electromagnetic field simulator and electromagnetic field simulation program, a Finite Difference Time Domain (FDTD) method is known (see, for example, Yee, K. S., "Numerical solution of initial boundary value problems involving Maxwell's equations in isotropic media", IEEE Transa, Antennas Propagat., Vol. Ap-14, p. 302-307, 1966, and Toru Uno, "Electromagnetic Field and Antenna Analysis using FDTD Method", 1998, CORONA PUBLISHING CO., LTD.). This technique spatially and temporally differentiates the Maxwell's equation which is a basic equation describing a time variation of an electromagnetic field and keeps track of the time variation of the electromagnetic field. According to this technique, spacing between grids (steps) used for discretization of space and time is set to a sufficiently small value and a time variation in the electromagnetic field can be simulated in detail. Advantages of such an FDTD method include simplicity of calculation principles, ease of speed enhancement of calculation, ability to evaluate a transient electromagnetic characteristic because a time waveform is calculated in principle and ease of three-dimensional calculation.

A formula whereby a time variation of an electromagnetic field component is calculated using the FDTD method will be shown below. (Excerpt from Allen Taflove, Susan C. Hagness: "Computational Electrodynamics")

[Formula 1-1]

$$E_x\big|_{i+1/2,j,k}^{n+1/2} = \left(\frac{1 - \frac{\sigma_{i+1/2,j,k}\Delta t}{2\varepsilon_{i+1/2,j,k}}}{1 + \frac{\sigma_{i+1/2,j,k}\Delta t}{2\varepsilon_{i+1/2,j,k}}}\right) E_x\big|_{i+1/2,j,k}^{n-1/2} \quad (1)$$

$$+ \left(\frac{\frac{\Delta t}{\varepsilon_{i+1/2,j,k}}}{1 + \frac{\sigma_{i+1/2,j,k}\Delta t}{2\varepsilon_{i+1/2,j,k}}}\right) \cdot \left(\frac{H_z\big|_{i+1/2,j+1/2,k}^{n} - H_z\big|_{i+1/2,j-1/2,k}^{n}}{\Delta y} - \right.$$

$$\left.\frac{H_y\big|_{i+1/2,j,k+1/2}^{n} - H_y\big|_{i+1/2,j,k-1/2}^{n}}{\Delta z} - J_{source_x}\big|_{i+1/2,j,k}^{n}\right)$$

[Formula 1-2]

$$H_x\big|_{i,j+1/2,k+1/2}^{n+1} = \left(\frac{1 - \frac{\sigma^*_{i,j+1/2,k+1/2}\Delta t}{2\mu_{i,j+1/2,k+1/2}}}{1 + \frac{\sigma^*_{i,j+1/2,k+1/2}\Delta t}{2\mu_{i,j+1/2,k+1/2}}}\right) H_x\big|_{i,j+1/2,k+1/2}^{n} \quad (2)$$

$$+ \left(\frac{\frac{\Delta t}{\mu_{i,j+1/2,k+1/2}}}{1 + \frac{\sigma^*_{i,j+1/2,k+1/2}\Delta t}{2\mu_{i,j+1/2,k+1/2}}}\right) \cdot \left(\frac{E_y\big|_{i,j+1/2,k+1}^{n+1/2} - E_y\big|_{i,j+1/2,k}^{n+1/2}}{\Delta z} - \right.$$

$$\left.\frac{E_z\big|_{i,j+1,k+1/2}^{n+1/2} - E_z\big|_{i,j,k+1/2}^{n+1/2}}{\Delta y} - M_{source_x}\big|_{i,j+1/2,k+1/2}^{n+1/2}\right)$$

Ex, Ey, Ez: Components of electric field
Hx, Hy, Hz: Components of magnetic field
Jsource x: Current source
Msource x: Magnetic current source
∈: Dielectric constant
σ: Conductivity
σ*: Magnetic conductivity
Δx, Δy, Δz: Space grid width
Δt: Time division width The subscripts i, j, k added at the bottom right of the electromagnetic field components denote space grid numbers and indicate coordinates of a simulation space. Furthermore, the subscripts n, n+1 added to the electromagnetic field components denote numbers indicating time steps and time advances by Δt when a time step advances by 1.

In order to obtain sufficient calculation accuracy using the FDTD method which is a method of calculating a difference formula, a time step and space step in simulation are preferably set to a small value, approximately ¹/₁₀ to ¹/₂₀ of the period and wavelength of light. Furthermore, in an actual simulation, instantaneous values of X, Y, Z components of the electric field and magnetic field for each grid of a model to be analyzed need to be saved in a main storage device made up of a RAM or the like. Since there is a limitation to the storage capacity of a computer, the size of a model is generally limited to several times the wavelength of an electromagnetic wave.

Since light is an electromagnetic wave having a wavelength of 1 micron or below, the domain that can be calculated using the FDTD method is limited to several microns and there have been only a few cases where the FDTD method is used for light simulations, but techniques for accessing information on an information storage medium using light have been developed in recent years and as near-field optics using optical elements having a structure smaller than the light wavelength become a focus of attention. Thus, there are an increasing number of cases where the behavior of light in a micro domain on the order of several times the light wavelength is analyzed. However, since such near-field optics have large effects of diffraction and cannot handle light as light rays, it is effective to analyze light as an electromagnetic wave using an electromagnetic field simulator and electromagnetic field simulation program using the FDTD method. Accordingly, these days, research into near-field optics applying the FDTD method to an optical model and development and design of optical elements are being actively conducted.

In both simulation of a communication radio wave and simulation of light, it is necessary to set a source for the electromagnetic wave. In the case of the communication radio wave or the like, a current flowing through an antenna or circuit can be set as the source. That is, a desired simulation can be realized by substituting the current of the circuit or the like into current source Jsource x of Formula (1) and Formula (2) and setting magnetic current source Msource x to "0".

On the other hand, when optical problems are calculated using the FDTD method, light is often introduced from the outside of an analysis domain (simulation space), and so a method of subjecting the electric field to forced vibration at a frequency of the incident wave in part of the simulation space is used to reproduce the incident light. The part where the electric field is subjected to forced vibration is called a "wave source". This wave source does not exist in an actual analysis target and is virtually set to conduct an analysis.

The simplest scheme for realizing this is to subject the electric field Ex to forced vibration according to Formula (a) shown below without applying Formula (1) to the portion of the wave source:

[Formula 2]

$$E_x|_{i+1/2,j,k}^{n+1/2} = E_0|_{i+1/2,j,k} \sin(\omega t + \phi) \quad (a)$$

Furthermore, for parts other than the wave source, executing the calculations of Formula (1) and Formula (2) with both the current source Jsource x and magnetic current source Msource x set to "0" causes the vibration of the electric field Ex of the wave source portion to transmit to the electric field and magnetic field within the simulation space and causes light propagation to be simulated. However, subjecting the electric field Ex to forced vibration in this way produces a phenomenon that light is reflected due to the placement of the wave source.

FIG. 1 shows a simulation example based on the scheme under which the electric field Ex is subjected to forced vibration.

This figure shows a model in which a linear wave source 1 is disposed at the top and a reflecting surface 2 is disposed at a position facing the wave source 1. Furthermore, in this model, the wave source 1 is given a current source corresponding to a spherical wave which converges toward the reflecting surface 2.

The simulation result shown in FIG. 1 shows interference patterns parallel to the reflecting surface 2 between the wave source 1 and reflecting surface 2. This is attributable to the fact that light reflected on the reflecting surface 2 is returned to the wave source 1 and further reflected on the wave source 1, causing multiple reflections, which is a wrong result of the presence of the virtual wave source 1 affecting the calculation.

A technique for avoiding such reflection by the wave source 1 is already known and there is a proposal to use Formula (3) instead of Formula (a) above.

[Formula 3]

$$E_x|_{i+1/2,j,k}^{n+1/2} = \left(\frac{1 - \frac{\sigma_{i+1/2,j,k}\Delta t}{2\varepsilon_{i+1/2,j,k}}}{1 + \frac{\sigma_{i+1/2,j,k}\Delta t}{2\varepsilon_{i+1/2,j,k}}}\right) E_x|_{i+1/2,j,k}^{n-1/2}$$

$$+ \left(\frac{\frac{\Delta t}{\varepsilon_{i+1/2,j,k}}}{1 + \frac{\sigma_{i+1/2,j,k}\Delta t}{2\varepsilon_{i+1/2,j,k}}}\right) \cdot \left(\frac{H_z|_{i+1/2,j+1/2,k}^n - H_z|_{i+1/2,j-1/2,k}^n}{\Delta y} - \frac{H_y|_{i+1/2,j,k+1/2}^n - H_y|_{i+1/2,j,k-1/2}^n}{\Delta z}\right) + E_0|_{i+1/2,j,k} \sin(\omega t + \phi)$$

$$(3)$$

where E0 is an amplitude of the electric field of the incident wave in the wave source, ω is an angular frequency of the incident wave, φ is an initial phase of the incident wave in the wave source and the amplitude E0 of the electric field of the incident wave is a function of coordinates.

In this Formula (3), a value obtained by adding an electric field component when light propagation from the outside of the wave source is calculated to an electric field component vibrating as the incident wave is used. For this reason, light propagation is calculated even in the wave source, and therefore reflection is not produced.

FIG. 2 shows a simulation example with consideration given to light propagation in the wave source.

The same model used in FIG. 1 is used here, too.

Because there is no more reflection by the wave source 1, the simulation result shown in this FIG. 2 shows arc-shaped stripe patterns between the wave source 1 and reflecting surface 2 produced by one-time interference between light propagating from the wave source 1 toward the reflecting surface 2 and reflected light propagating from the reflecting surface 2 toward the wave source 1.

The wave source in which reflection is produced by subjecting the current source to forced vibration as shown in Formula (a) is called a "hard source", while the wave source in which a propagation term is added to vibration of the incident wave as shown in Formula (3) is called a "soft source". Soft source is generally used in optical analyses.

However, in the case of the wave source set using the soft source in Formula (3), the amplitude of the incident wave which is expected as a precondition for the simulation is not correctly reflected in simulation results, which poses a problem that intensity of incident light cannot be set correctly.

FIG. 3 shows an example of a simulation for confirming intensity of incident light and FIG. 4 shows another example of a simulation for confirming intensity of incident light.

In FIG. 3, electric field vibration of light propagating through a medium having a refractive index of 1.5 is simulated when the electric field of an incident wave of the wave source is subjected to vibration using a sine wave having an amplitude of 1 V/m.

As calculation conditions, a first condition under which the size of grids in the light propagation direction is set to 10 nm and time step is set to 13.343 as and a second condition under which the size of grids is set to 20 nm and time step is set to 18.792 as are used. FIG. 3 shows simulation results under the respective calculation conditions. According to the simulation results shown here, though the amplitude of the wave source and the physical analysis model are invariable, the amplitude varies depending on the difference in the calculation conditions. Moreover, none of the electric field amplitudes obtained from the simulation results matches the amplitude of 1 V/m which should originally be obtained.

In FIG. 4, a Gaussian pulse having a pulse width of 16.7 ns with the electric field of an incident wave having a peak electric field of 1 V/m is set and electric field vibration of propagating light is simulated for each of four different types of refractive index of the wave source. Note that the grid size and space step are commonly set to 10 nm and 10 as respectively for all the four types of refractive indices.

In the simulation result shown in this FIG. 4 as in the case of the sine wave shown in FIG. 3, the amplitude of the propagating electric field vibration varies depending on the refractive index though the setting of the electric field of the wave source is constant.

SUMMARY OF THE INVENTION

The present invention has been made in view of the above circumstances and provides an electromagnetic field simulator capable of accurately simulating the amplitude of an electromagnetic wave and an electromagnetic field simulation program storage medium storing an electromagnetic field simulation program.

The electromagnetic field simulator according to the present invention is an electromagnetic field simulator which uses a spatial distribution of an electromagnetic field at a certain time to repeatedly calculate a spatial distribution of the electromagnetic field at the next time, including: a discrete model setting section which sets a space grid width and a time step in a simulation of the electromagnetic field; a coefficient setting section which sets coefficients of formula (1) and formula (2) at various positions in a simulation space, based on electromagnetic physical properties; a wave source setting section which sets a position and amplitude of a wave source of the electromagnetic wave as a boundary condition with respect to the spatial distribution of the electromagnetic field; and an amplitude calculation section which calculates amplitude of an electromagnetic field component given to the position of the wave source in the simulation space, based on the space grid width and the time step set by the discrete model setting section and the electromagnetic physical properties, so that the electromagnetic wave having the position and amplitude of the wave source set by the wave source setting section is reproduced in simulation results.

According to the electromagnetic field simulator of the present invention, the amplitude of the electromagnetic field component given to the position of the wave source is calculated based on the space grid width, the time step and electromagnetic physical properties, and therefore a desired electromagnetic wave amplitude can be reproduced accurately in simulation.

The electromagnetic field simulator of the present invention is preferably provided with a wave source formation section which continues to give the sum of the electromagnetic field component of amplitude obtained by the amplitude calculation section and the electromagnetic field component propagating from the outside of the position of the wave source, at the position of the wave source in the simulation space during the simulation of the electromagnetic field.

The provision of such a wave source formation section avoids reflection of electromagnetic waves from the wave source.

Furthermore, the amplitude calculation section of the electromagnetic field simulator of the present invention preferably calculates amplitude $E0'$ of the electric field component given at the position of the wave source, based on the desired wave amplitude $E0$, a dielectric constant $\in$ and magnetic permeability $\mu$ at the position of the wave source, and the time step $\Delta t$ and the space grid width $\delta z$ in the electromagnetic wave traveling direction set by the discrete model setting section as:

$$E0'=2\Delta t\, E0/\{\delta z\sqrt{(\in\mu)}\}$$

Using such a formula makes it possible to easily obtain an electric field component capable of accurately reproducing light of desired wave amplitude $E0$ and reproduce desired light in simulation.

The electromagnetic field simulation program storage medium of the present invention stores an electromagnetic field simulation program incorporated in a computer, causing the computer to use a spatial distribution of an electromagnetic field at a certain time to repeatedly calculate a spatial distribution of the electromagnetic field at the next time, which constructs on the computer: a discrete model setting section which sets a space grid width and a time step in a simulation of the electromagnetic field, a coefficient setting section which sets coefficients of formula (1) and formula (2) based on electromagnetic physical properties at various positions in a simulation space; a wave source setting section which sets a position and amplitude of a wave source of the electromagnetic wave as a boundary condition with respect to a spatial distribution of the electromagnetic field; and an amplitude calculation section which calculates amplitude of an electromagnetic field component given to the position of the wave source in the simulation space based on the space grid width and the time step set by the discrete model setting section and the electromagnetic physical properties at the position of the wave source, so that the electromagnetic wave having the position and amplitude of the wave source set by the wave source setting section is reproduced in simulation results.

The electromagnetic field simulation program of the present invention allows the computer to easily realize elements to construct the electromagnetic field simulator according to the present invention.

In the elements such as the discrete model setting section constructed by the electromagnetic field simulation program of the present invention on the computer, one element may be constructed of one program component or one element may be constructed of two or more program components or two or more elements may be constructed of one program component. Furthermore, these elements may be constructed so as to execute such operations by the own elements or may be constructed so as to execute such operations by giving instructions to other programs or program components incorporated in the computer.

As has been explained so far, the present invention can simulate the amplitude of an electromagnetic wave accurately.

DETAILED DESCRIPTION OF THE INVENTION

With reference now to the attached drawings, an embodiment of the present invention will be explained below.

Here, an explanation will be given about an example in which a program stored in an embodiment of an electromagnetic field simulation program storage medium of the present invention is incorporated in and executed by a computer to thereby construct the embodiment of the electromagnetic field simulator of the present invention on the computer.

Figure 5:
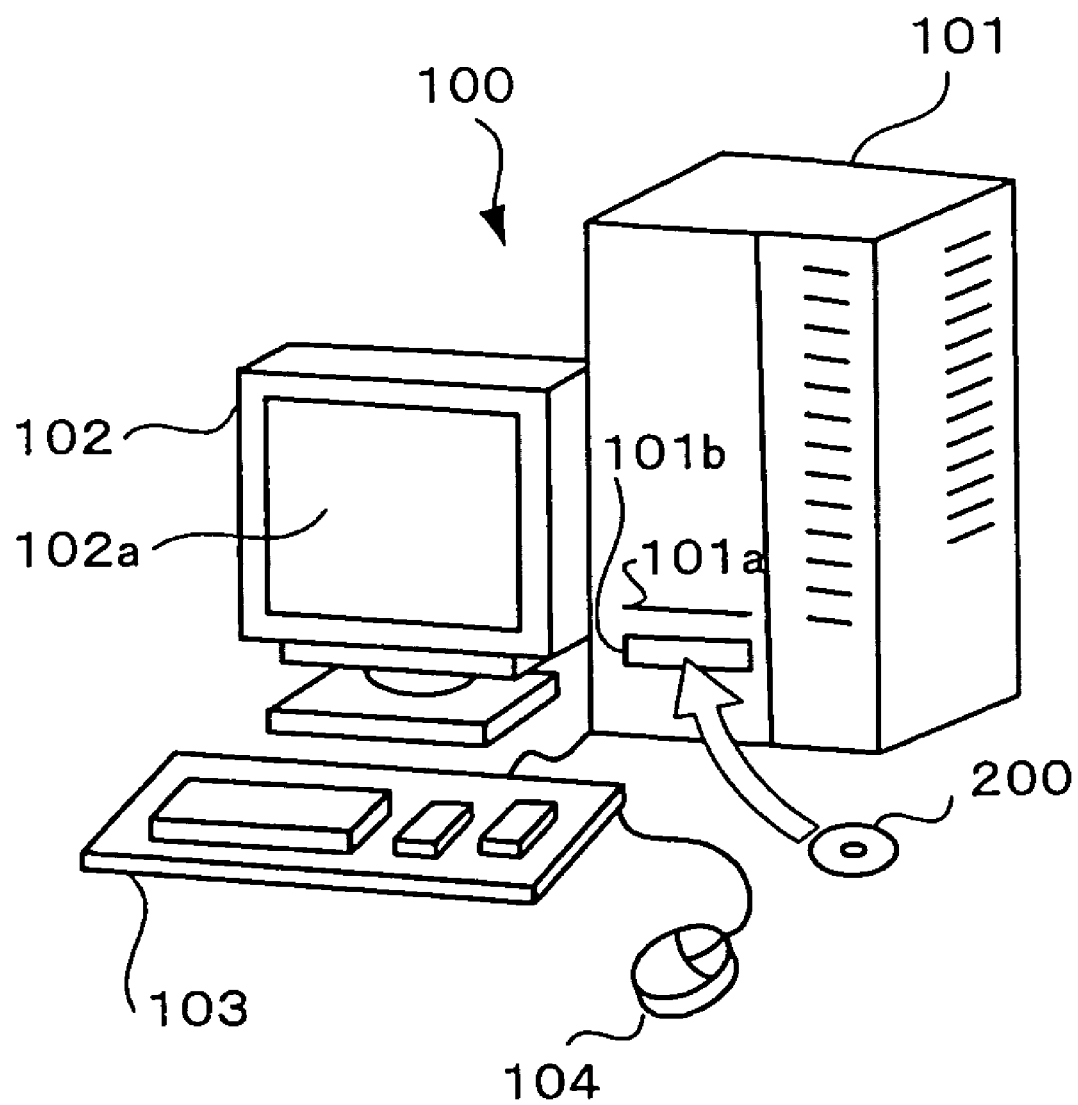
FIG. 5 is an outside perspective view showing a computer to which an embodiment of the present invention is applied.

FIG. 5 is an outside perspective view showing a computer to which the embodiment of the present invention is applied.

A computer 100 is provided with a main unit 101 which incorporates a CPU, RAM memory, hard disk or the like, a CRT display 102 which performs screen display on a fluorescent surface 102a according to an instruction from the main unit 101, a keyboard 103 for inputting a user's instruction and character information to this computer and a mouse 104 for indicating an arbitrary position on the fluorescent surface 102a to thereby input an instruction according to the position.

In an outside view, the main unit 101 is further provided with a flexible disk loading slot 101a and a CD-ROM loading slot 101b in which a flexible disk 210 (not shown in FIG. 5; see FIG. 6) and a CD-ROM 200 are loaded respectively, and a flexible disk drive 114 and a CD-ROM drive 115 for driving the flexible disk and CD-ROM 200 loaded respectively (see FIG. 6) are also mounted therein.

According to this embodiment, the CD-ROM 200 is the embodiment of the electromagnetic field simulation program storage medium of the present invention and this CD-ROM 200 is loaded from the CD-ROM loading slot 101b into the main unit 101 and the CD-ROM drive 115 installs an electromagnetic field simulation program stored in the CD-ROM 200 into a hard disk of this computer 100. When the electromagnetic field simulation program installed in the hard disk of this computer 100 is started, the embodiment of the electromagnetic field simulator of the present invention is constructed on this computer 100.

Figure 6:
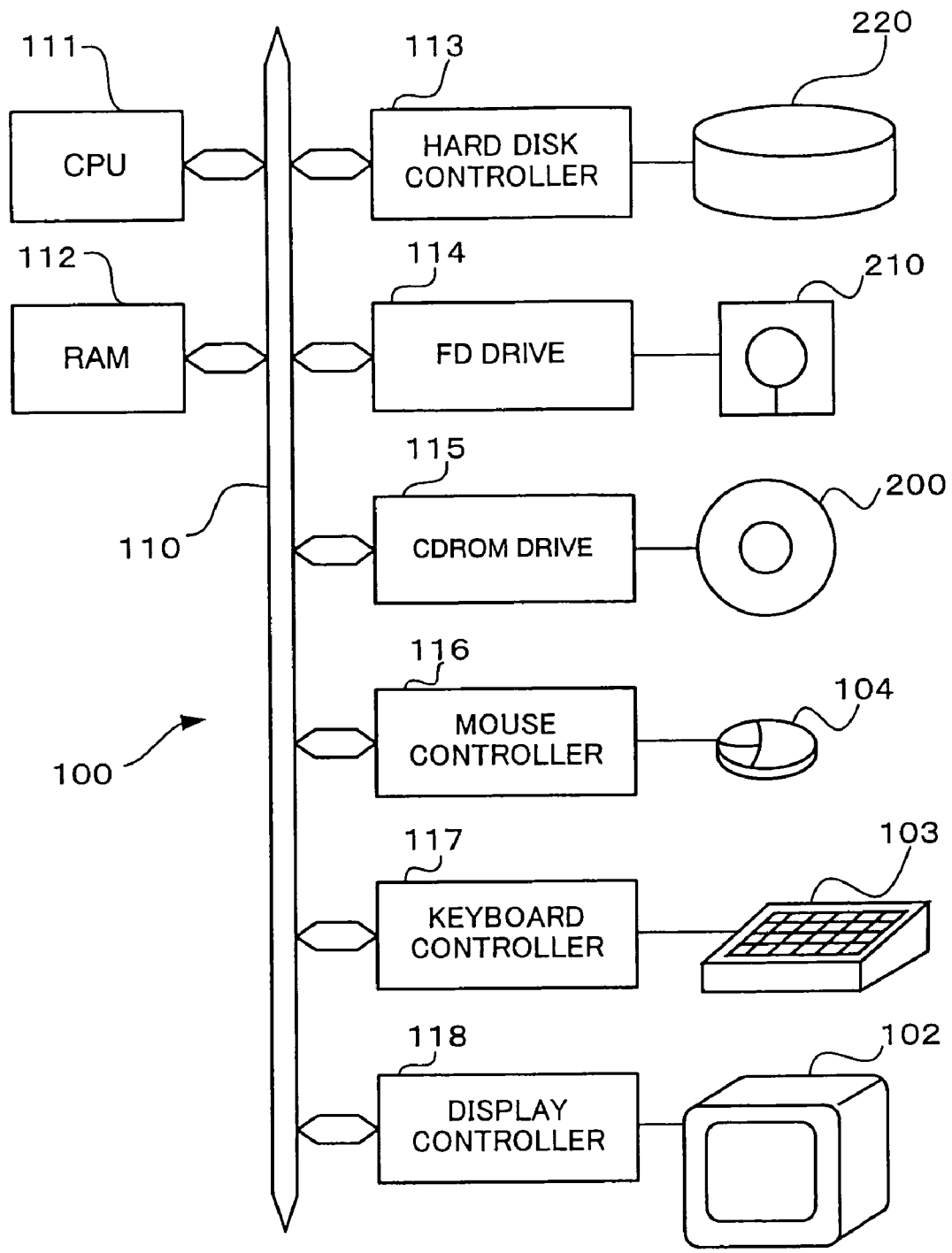
FIG. 6 is a hardware block diagram of the computer shown in FIG. 5.

FIG. 6 is a hardware block diagram of the computer shown in FIG. 5.

As shown here, the computer 100 is provided with a central processing unit (CPU) 111, a RAM 112, a hard disk controller 113, the flexible disk drive 114, the CD-ROM drive 115, a mouse controller 116, a keyboard controller 117 and a display controller 118 and these are mutually connected by a bus 110.

As explained with reference to FIG. 5, the flexible disk drive 114 and CD-ROM drive 115 are loaded respectively with the flexible disk 210 and CD-ROM 200 to access the loaded flexible disk 210 and CD-ROM 200 respectively.

Furthermore, this block diagram also shows the hard disk 220 accessed by the hard disk controller 113, the mouse 104 controlled by the mouse controller 116, the keyboard 103 controlled by the keyboard controller 117 and the CRT display 102 controlled by the display controller 118.

As described above, the CD-ROM 200 stores the electromagnetic field simulation program, the CD-ROM drive 115 reads the electromagnetic field simulation program from the CD-ROM 200, and the hard disk controller 113 stores the electromagnetic field simulation program in the hard disk 220 via the bus 110. In the actual execution, the electromagnetic field simulation program inside the hard disk 220 is loaded into the RAM 112 and executed by the CPU 111.

Figure 7:
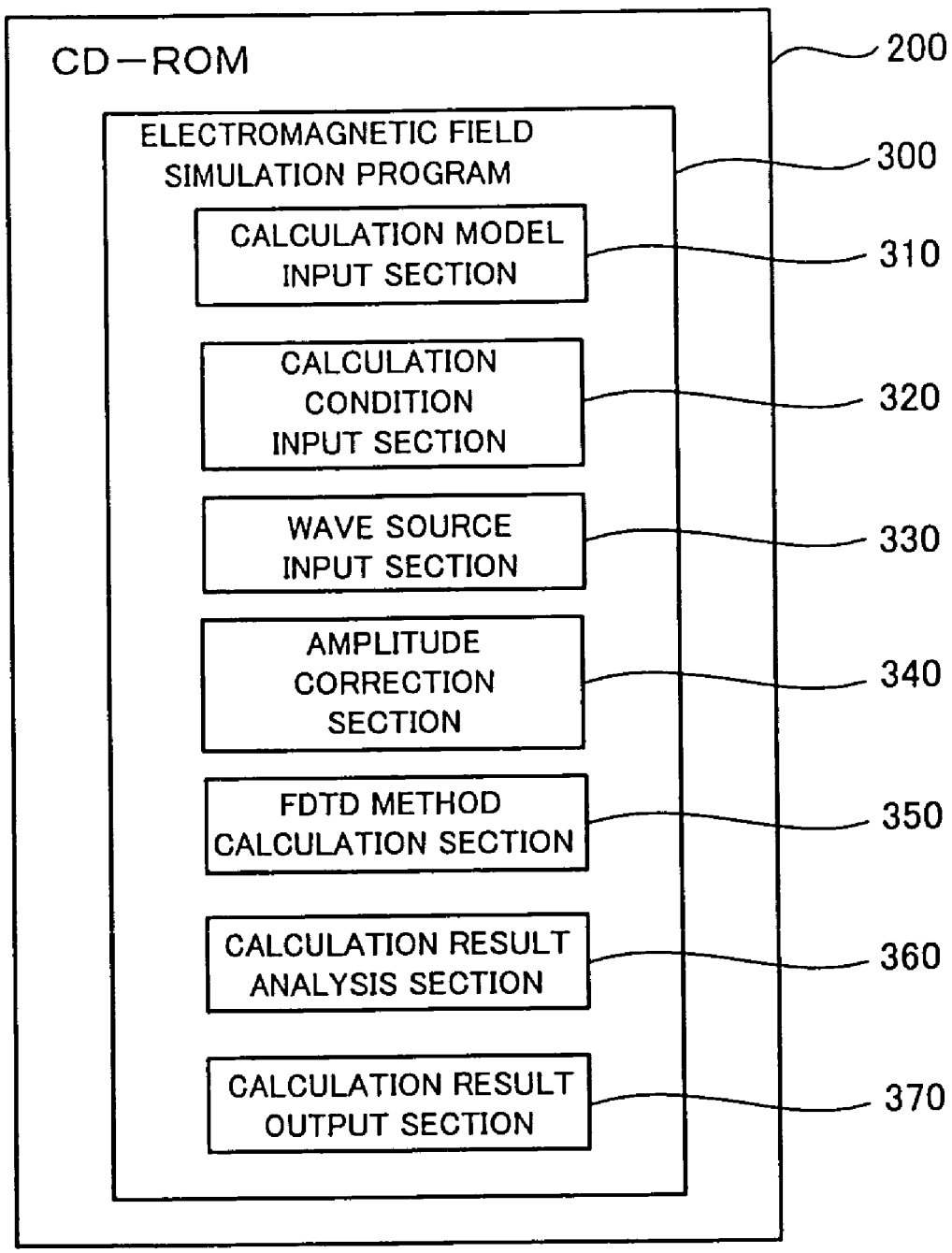
FIG. 7 shows an embodiment of an electromagnetic field simulation program storage medium according to the present invention.

FIG. 7 shows the embodiment of the electromagnetic field simulation program storage medium according to the present invention. Here, the electromagnetic field simulation program 300 is stored in the CD-ROM 200 as an embodiment thereof.

This electromagnetic field simulation program 300 is executed inside the computer 100 shown in FIG. 5 and the computer 100 is operated as the electromagnetic field simulator for simulating the electromagnetic field and is provided with a calculation model input section 310, a calculation condition input section 320, a wave source input section 330, an amplitude correction section 340, an FDTD method calculation section 350, a calculation result analysis section 360 and a calculation result output section 370.

Details of the respective elements of this electromagnetic field simulation program 300 will be explained later.

Figure 8:
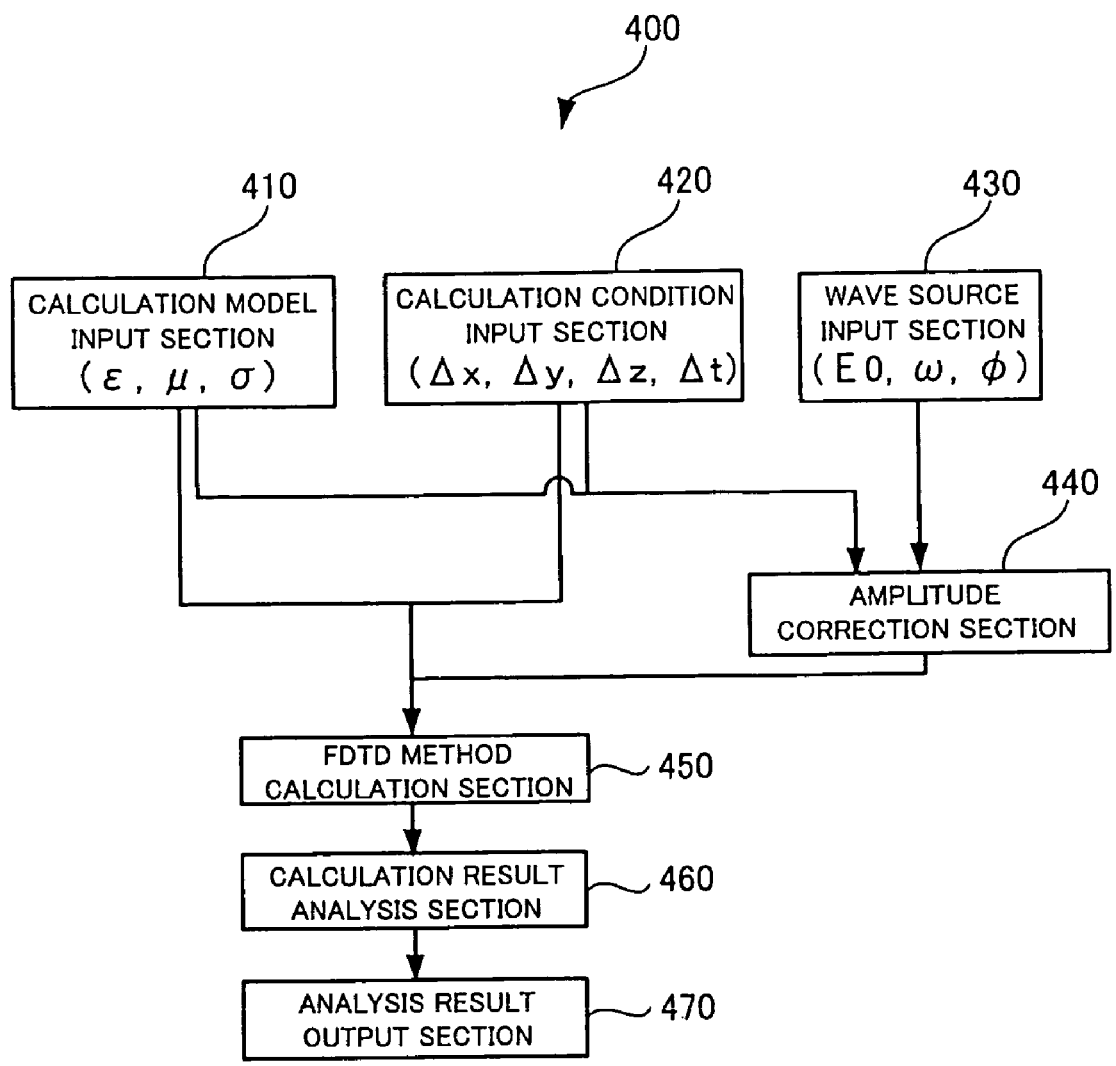
FIG. 8 is a functional block diagram according to the embodiment of the electromagnetic field simulator of the present invention.

FIG. 8 is a functional block diagram according to an embodiment of the electromagnetic field simulator of the present invention.

This electromagnetic field simulator 400 is constructed by the electromagnetic field simulation program 300 in FIG. 7 being installed in and executed by the personal computer 100 shown in FIG. 5.

This electromagnetic field simulator 400 is constructed of a calculation model input section 410, a calculation condition input section 420, a wave source input section 430, an amplitude correction section 440, an FDTD method calculation section 450, a calculation result analysis section 460 and a calculation result output section 470, which are respectively configured on the personal computer 100 by the calculation model input section 310, calculation condition input section 320, wave source input section 330, amplitude correction section 340, FDTD method calculation section 350, calculation result analysis section 360 and calculation result output section 370 that constitute the electromagnetic field simulation program 300 shown in FIG. 7.

In this way, the elements of the electromagnetic field simulator 400 shown in FIG. 8 correspond to the elements of the electromagnetic field simulation program 300 shown in FIG. 7, but both elements are different in that the elements in FIG. 8 are constructed of a combination of the hardware of the personal computer 100 shown in FIG. 5 and an OS and application program executed by the personal computer, whereas the respective elements shown in FIG. 7 are constructed of only the application program thereof.

The elements of the electromagnetic field simulator 400 shown in FIG. 8 will be explained in detail below and the elements of the electromagnetic field simulation program 300 shown in FIG. 7 will also be explained together.

The calculation model input section 410 corresponds to an example of the coefficient setting section described in the present invention and is intended to input a physical model to be simulated by setting physical property values such as refractive index for a simulation space.

The calculation condition input section 420 corresponds to an example of the discrete model setting section described in the present invention and is intended to input time-space calculation conditions in simulation, that is, time step interval and space grid width.

The wave source input section 430 corresponds to an example of the wave source setting section and is intended to set incident light corresponding to the physical model by inputting the electric field amplitude, angular frequency and initial phase.

The keyboard 103, mouse 104 and CPU 111 shown in FIG. 6 are hardware responsible for these calculation model input section 410, calculation condition input section 420 and wave source input section 430.

The amplitude correction section 440 corresponds to an example of the amplitude calculation section described in the present invention and corrects the electric field amplitude based on the physical model and calculation condition so that incident light is reproduced in the simulation result.

The FDTD method calculation section 450 simulates the electromagnetic field using the FDTD method and assumes the role as an example of the wave source formation section described in the present invention.

Here, a simulation of an electromagnetic field and correction of the electric field amplitude using the FDTD method will be explained in detail. According to this FDTD method, the simulation space is divided into many grids and components of the electromagnetic field are arranged on the respective grids. Furthermore, variables in a three-dimensional array for storing the components arranged on the grids are provided in the RAM 112 shown in FIG. 6.

Figure 9:
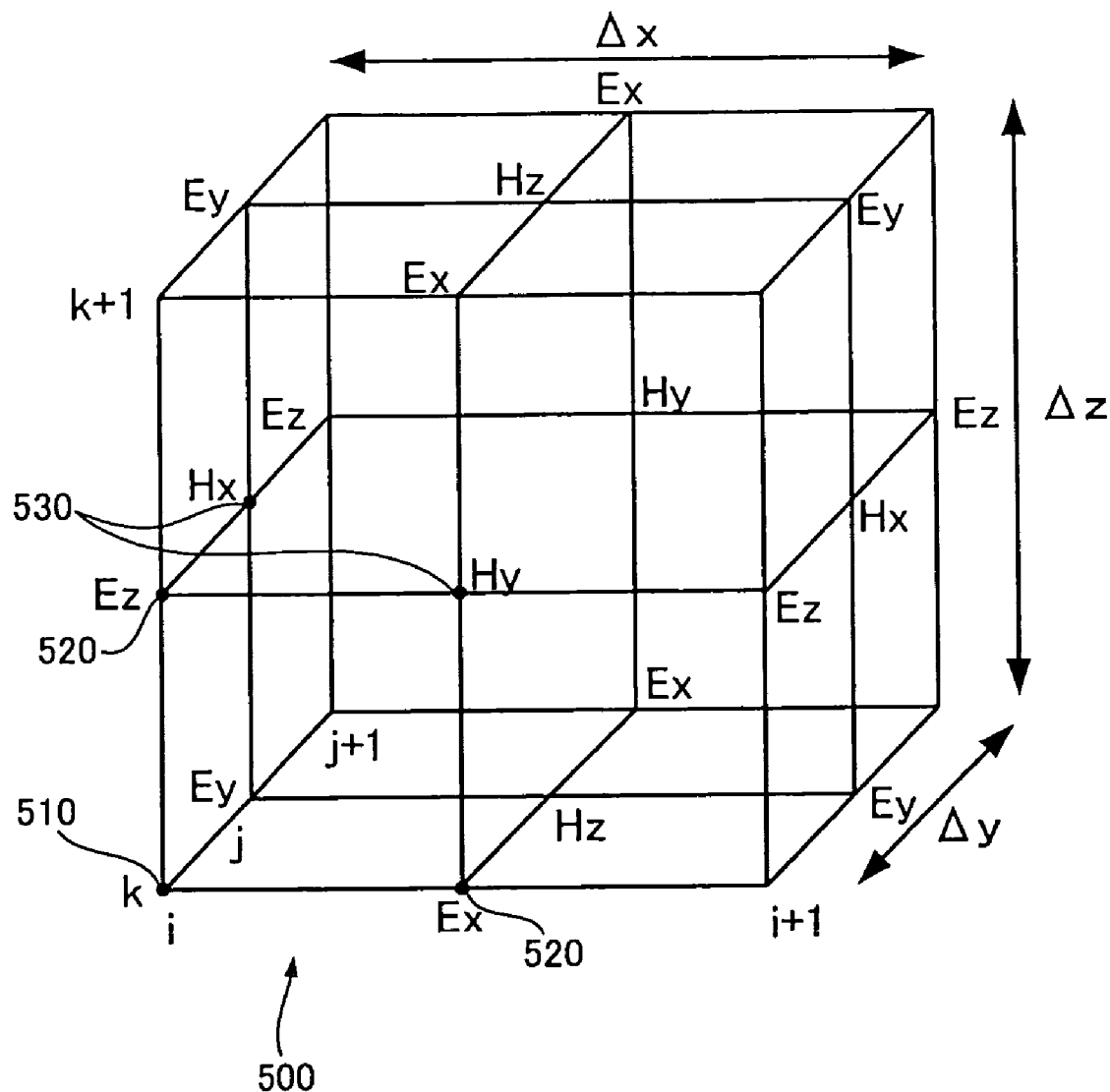
FIG. 9 shows components of the electromagnetic field arranged on a grid.

FIG. 9 shows components of the electromagnetic field arranged on a grid.

Of many grids into which the space is divided, one grid 500 is shown here and the size of the grid 500 is equal to space steps $\Delta x, \Delta y, \Delta z$ of the divided space. A vertex 510 of the grid 500 is associated with array numbers of variables of a three-dimensional array and the vertex 510 at the bottom left in FIG. 9 corresponds to array numbers (i, j, k).

According to the FDTD method, an electric field component parallel to a side is disposed at a midpoint 520 of each side of the grid 500 and a magnetic field component perpendicular to a plane is disposed at a center 530 of each plane of the grid 500. For this reason, values "½" are used as array numbers of variables of a three-dimensional array for storing these electromagnetic field components, and midpoints 520 of sides are indicated with array numbers such as (i+½, j, k) and (i, j+½, k) and centers 530 of planes are indicated with array numbers such as (i+½, j+½, k) and (i, j+½, k+½). Such array numbers correspond to space coordinates.

Formulas for calculating time variations of such electromagnetic field components are shown below:

[Formula 4]

$$E_x \Big|_{i+1/2,j,k}^{n+1/2} = \left( \frac{1 - \frac{\sigma_{i+1/2,j,k} \Delta t}{2\varepsilon_{i+1/2,j,k}}}{1 + \frac{\sigma_{i+1/2,j,k} \Delta t}{2\varepsilon_{i+1/2,j,k}}} \right) E_x \Big|_{i+1/2,j,k}^{n-1/2}$$

$$+ \left( \frac{\frac{\Delta t}{\varepsilon_{i+1/2,j,k}}}{1 + \frac{\sigma_{i+1/2,j,k} \Delta t}{2\varepsilon_{i+1/2,j,k}}} \right) \cdot \left( \frac{H_z \Big|_{i+1/2,j+1/2,k}^{n} - H_z \Big|_{i+1/2,j-1/2,k}^{n}}{\Delta y} - \frac{H_y \Big|_{i+1/2,j,k+1/2}^{n} - H_y \Big|_{i+1/2,j,k-1/2}^{n}}{\Delta z} \right) +$$

$$A_{i+1/2,j,k} E_0 \Big|_{i+1/2,j,k} \sin(\omega t + \phi)$$

[Formula 5]

$$H_x \Big|_{i,j+1/2,k+1/2}^{n+1} = \left( \frac{1 - \frac{\sigma^*_{i,j+1/2,k+1/2} \Delta t}{2\mu_{i,j+1/2,k+1/2}}}{1 + \frac{\sigma^*_{i,j+1/2,k+1/2} \Delta t}{2\mu_{i,j+1/2,k+1/2}}} \right) H_x \Big|_{i,j+1/2,k+1/2}^{n} \quad (2)$$

$$+ \left( \frac{\frac{\Delta t}{\mu_{i,j+1/2,k+1/2}}}{1 + \frac{\sigma^*_{i,j+1/2,k+1/2} \Delta t}{2\mu_{i,j+1/2,k+1/2}}} \right) \cdot \left( \frac{E_y \Big|_{i,j+1/2,k+1}^{n+1/2} - E_y \Big|_{i,j+1/2,k}^{n+1/2}}{\Delta z} - \frac{E_z \Big|_{i,j+1,k+1/2}^{n+1/2} - E_z \Big|_{i,j,k+1/2}^{n+1/2}}{\Delta y} - M_{source_x} \Big|_{i,j+1/2,k+1/2}^{n+1/2} \right)$$

Ex, Ey, Ez: Components of electric field
Hx, Hy, Hz: Components of magnetic field
∈: Dielectric constant
σ: Conductivity
σ*: Magnetic conductivity
$\Delta x, \Delta y, \Delta z$: Space grid width
$\Delta t$: Time division width
E0: Electric field amplitude of incident wave of wave source
A: Correction coefficient of electric field amplitude
ω: Angular frequency of incident wave
φ: Initial phase of incident wave of wave source Subscripts i, j, k added at the bottom right of the electromagnetic field components are array numbers corresponding to grid numbers and indicate coordinates of the simulation space. On the other hand, subscripts n, n+1 added to the electromagnetic field components are numbers indicating time steps and time advances by $\Delta t$ when a time step advances by 1.

Formula (3)' is an improved version of Formula (3) of the soft source shown in the field "Description of the Related Art" and the electric field amplitude E0 is multiplied by a correction coefficient A.

As shown in Formula (3)', the x component of the electric field at time step "n+½" is calculated from the x component of the electric field at time step "n−½" one step older, the y component and z component of the magnetic field at time step "n" ½ step older, and the x component of the current source at time step "n". At this time, the y component and z component of the magnetic field surrounding the x component Ex of the electric field on the grid 500 shown in FIG. 9 are used as the y component and z component of the magnetic field. As shown in Formula (2), the x component of the magnetic field is likewise calculated from the electromagnetic field components in the past. Note that there is a difference of ½ step in the time step between the electric field component and magnetic field component and Formula (3)' and Formula (2) are executed alternately.

These Formula (3)' and Formula (2) are formulas to calculate the x component of the electromagnetic field but the y component and z component of the electromagnetic field are also calculated according to similar formulas. Calculations according to these formulas are performed by the FDTD method calculation section 450 in FIG. 8 and data expressing a field of electromagnetic field vector is stored in the variables of a three-dimensional array provided for the RAM 112 shown in FIG. 6.

Next, calculations of the correction coefficient A in Formula (3)' will be explained.

Since the soft source also calculates light propagating through the wave source simultaneously, the result varies depending on calculation conditions such as time step intervals and cell size and physical property values such as refractive index of the location where the wave source is placed. When calculation Formula (3) of the conventional soft source is observed, coefficients associated with the electric field and magnetic field on the right side include physical property values such as $\varepsilon$, $\sigma$, $\sigma^*$ and variables defined by the calculation conditions such as $\Delta x$, $\Delta t$. This means that when the electric field in the next time step is calculated, the contributions of the electric field and magnetic field to be referenced are affected by both the physical model and calculation conditions. Therefore, the amplitude of the electric field applied forcibly to the wave source also needs to be corrected according to the physical model and calculation conditions.

A basic formula for calculating this correction coefficient will be considered using Formula (1) for generating a virtual current for the position of the wave source. According to Formula (1) and Formula (2) (magnetic current source is "0"), a physical phenomenon that a magnetic field is generated from a current and an electric field is generated from this magnetic field is simulated. The wave source is actually often placed in vacuum or in an insulator such as glass, and therefore this current is merely imaginary.

Furthermore, for convenience of calculations, consider light, which is linearly polarized light propagating in a Z direction and has E0 as an X component of the electric field of and "0" as a Y component, as the incident light. Also suppose that no absorption occurs at the position of the wave source, that is, conductivity $\sigma$ is "0". When a current flows, a magnetic field in a right-handed screw direction is generated around the current according to Ampere's rule. The relationship between the magnetic field and the current is expressed by the following formula:

[Formula 6]

$$\oint H \cdot ds = \iint J' \cdot dS \quad (4)$$

Next, this Ampere's rule is applied to the grid explained in FIG. 9.

Figure 10:
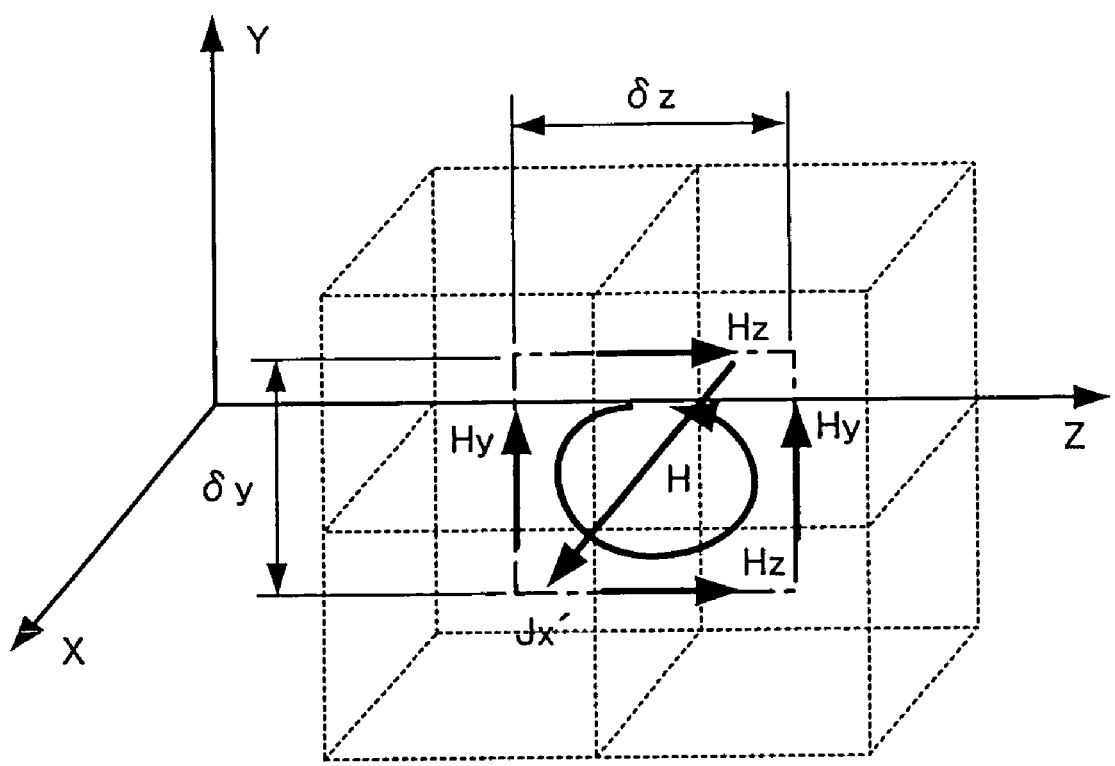
FIG. 10 shows Ampere's rule applied to the grid explained in FIG. 9.

FIG. 10 shows a situation in which Ampere's rule is applied to the grid explained in FIG. 9.

This FIG. 10 shows a current Jx' and magnetic fields Hy, Hz that surround the current Jx' on a grid in an analysis space according to the FDTD method. When Ampere's rule Formula (4) is applied to these current Jx' and magnetic fields Hy, Hz, next Formula (5) is obtained:

[Formula 7]

$$\delta y_j (Hy|_{i+1/2,j,k+1/2} - Hy|_{i+1/2,j,k-1/2}) - \delta z_k (Hz|_{i+1/2,j+1/2,k} - Hz|_{i+1/2,j-1/2,k}) = \delta y_j \delta z_k \cdot Jx'|_{i+1/2,j,k} \quad (5)$$

where the orientation of the magnetic field has a positive value in the + direction of the axis.

On the other hand, the magnetic field component of a plane wave propagating in the Z direction and having an electric field amplitude of Ex=E0, Ey=0 satisfies next relational Formula (6) using the dielectric constant and magnetic permeability of the medium:

[Formula 8]

$$\begin{cases} Hz = Hx = 0, \\ Hy|_{i+1/2,j,k+1/2} = -Hy|_{i+1/2,j,k-1/2} = \sqrt{\frac{\varepsilon}{\mu}} E_0 \sin(\omega t + \phi) \end{cases} \quad (6)$$

The relationship between the current and magnetic field is obtained from Formula (5) and the relationship between the magnetic field and electric field is obtained from Formula (6), and therefore when these Formula (5) and Formula (6) are put together, the intensity of the current that generates the electric field amplitude E0 is calculated as:

[Formula 9]

$$Jx'|_{i+1/2,j,k} = \frac{2}{\delta z_k} \sqrt{\frac{\varepsilon}{\mu}} E_0 \sin(\omega t + \phi) \quad (7)$$

When this Formula (7) is applied to Formula (1) which uses the virtual current source and conductivity a is assumed to be "0", then the term of the current becomes:

[Formula 10]

$$\frac{\Delta t}{\varepsilon} Jx'|_{i+1/2,j,k} = \frac{2\Delta t}{\delta z_k \sqrt{\varepsilon \mu}} E_0 \quad (8)$$

By comparing the term of the current obtained in this way is compared with the term of the incident wave of improved Formula (3)' of the soft source, the correction coefficient A is calculated and the formula of the electric field x component of the FDTD method becomes:

[Formula 11]

$$E_x|_{i+1/2,j,k}^{n+1/2} = \quad (9)$$

$$E_x|_{i+1/2,j,k}^{n-1/2} + \frac{\Delta t}{\varepsilon_{i+1/2,j,k}} \cdot \left( \frac{H_z|_{i+1/2,j+1/2,k}^n - H_z|_{i+1/2,j-1/2,k}^n}{\Delta y} - \frac{H_y|_{i+1/2,j,k+1/2}^n - H_y|_{i+1/2,j,k-1/2}^n}{\Delta z} \right) + \frac{2\Delta t}{\delta z_k \sqrt{\varepsilon_{i+1/2,j,k} \cdot \mu_{i+1/2,j,k}}} E_0 \sin(\omega t + \phi)$$

With regard to the part corresponding to the correction coefficient A of this Formula (9), the amplitude correction section 440 shown in FIG. 8 performs a calculation before executing a simulation. The FDTD method calculation section 450 substitutes the calculated value of the correction coefficient A into improved Formula (3)' and a simulation is substantially conducted according to Formula (9). In this explanation, the plane wave has been used for simplicity of explanation, but since a wave in any mode can be locally approximated by a plane wave, the value of the correction coefficient A for incident waves in other modes can also be obtained from the third term of Formula (9). Furthermore, the precondition that there is no absorption of the wave source and conductivity $\sigma$ is "0" has been used, but the absorption which originally occurs in the part set for the wave source is calculated with a different term again, and therefore even when it is assumed that there is only a wave source and only the incident light has no absorption, there is no special influence on the simulation as a whole.

As a simulation with the correction coefficient A added is conducted in this way, the incident light input by the wave source input section 430 shown in FIG. 8 is reflected accurately in the simulation result irrespective of the calculation conditions.

The calculation result analysis section 460 shown in FIG. 8 analyzes the electromagnetic field using the data of the electromagnetic field simulated by the FDTD method calculation section 450.

The calculation result output section 470 saves the result of the analysis by the calculation result analysis section 460 in the hard disk 220. The calculation result output section 470 also processes the data in the form of a graph and displays it on the CRT display 102 shown in FIG. 5.

Here, the overall operating procedure of the electromagnetic field simulator 400 will be reorganized using a flow chart.

Figure 11:
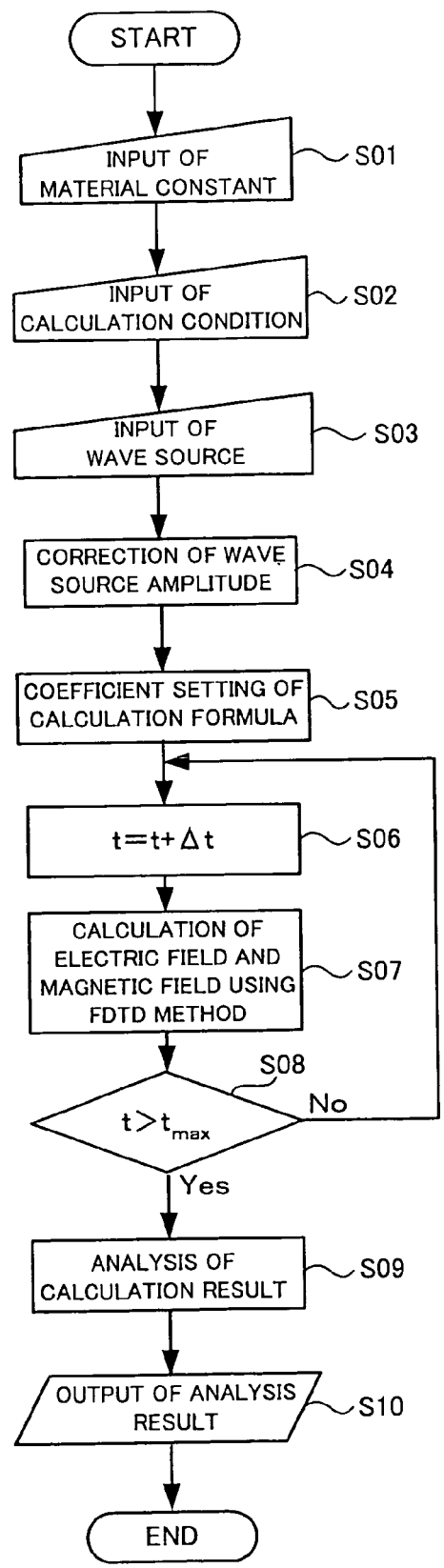
FIG. 11 is a flow chart showing an overall operating procedure of the electromagnetic field simulator.

FIG. 11 is a flow chart showing the overall operating procedure of the electromagnetic field simulator 400.

In the explanation of the flow chart shown in FIG. 11, the elements shown in FIG. 8 may be referenced without mentioning figure numbers.

Once the operation of the electromagnetic field simulator 400 is started, various physical coefficients (material constants) such as dielectric constant $\in$ and conductivity $\sigma$ used in Formula (3)' and Formula (2) are input by the calculation model input section 410 based on the model to be simulated (step S01).

Next, the space grid widths $\Delta x$, $\Delta y$, $\Delta z$ in the grid 500 shown in FIG. 9 and time step interval $\Delta t$ of the electromagnetic field to be simulated are input by the calculation condition input section 420 as calculation conditions (step S02).

Furthermore, the amplitude E0, angular frequency $\omega$ and initial phase $\phi$ of light incident upon the simulation target are input by the wave source input section 430 (step S03). At this time, when the amplitude E0 is input as a function of coordinates, plane waves or spherical waves or the like are set, and when the amplitude E0 is input as a function of time, pulse waves or the like are set.

Then, the amplitude correction section 440 calculates the correction coefficient A corresponding to the amplitude E0 (step S04) and the respective coefficient values of improved Formula (3)' including the calculated value of the correction coefficient A are set in the FDTD method calculation section 450 (step S05).

Next, the time t in the model advances by time division width $\Delta t$ (step S06), the calculations using the FDTD method in accordance with Formula (3)' and Formula (2) are executed by the FDTD method calculation section 450 (step S07). At this time, since Formula (3)' that calculates the electric field components is ahead by ½ step, the calculations are executed in order of Formula (3)' and Formula (2). Furthermore, when the amplitude of an incident wave is a time function, the calculation of the time variation in accordance with the function is also executed. Of the electric field components obtained by calculations, those components necessary for subsequent analyses will be saved in the hard disk 220 shown in FIG. 6 as appropriate.

When the calculations of such Formula (3)' and Formula (2) are completed, it is then decided whether a time t in the model has exceeded an end time tmax at which the simulation calculation is terminated or not (step S08) and if it is decided that the time t is before the end time tmax, the process returns to step S06 and the procedure is repeated.

On the other hand, it is decided that the time t in the model exceeds the end time tmax in step S08, the FDTD method calculation section 450 terminates the simulation calculation and the calculation result analysis section 460 carries out an analysis of the simulation result (step S09). The detailed explanations of the analysis contents will be omitted here assuming that various conventionally known analyses are adopted as appropriate.

Finally, the calculation result output section 470 displays the analysis result in the form of a graph on the CRT display 102 shown in FIG. 5, saves the result in the hard disk 220 and terminates the operation of the electromagnetic field simulator 400.

The effect of the simulation by the electromagnetic field simulator 400 will be explained using a simulation example and analysis example to which a specific model is applied to the electromagnetic field simulator 400 according to this embodiment.

Figure 1:
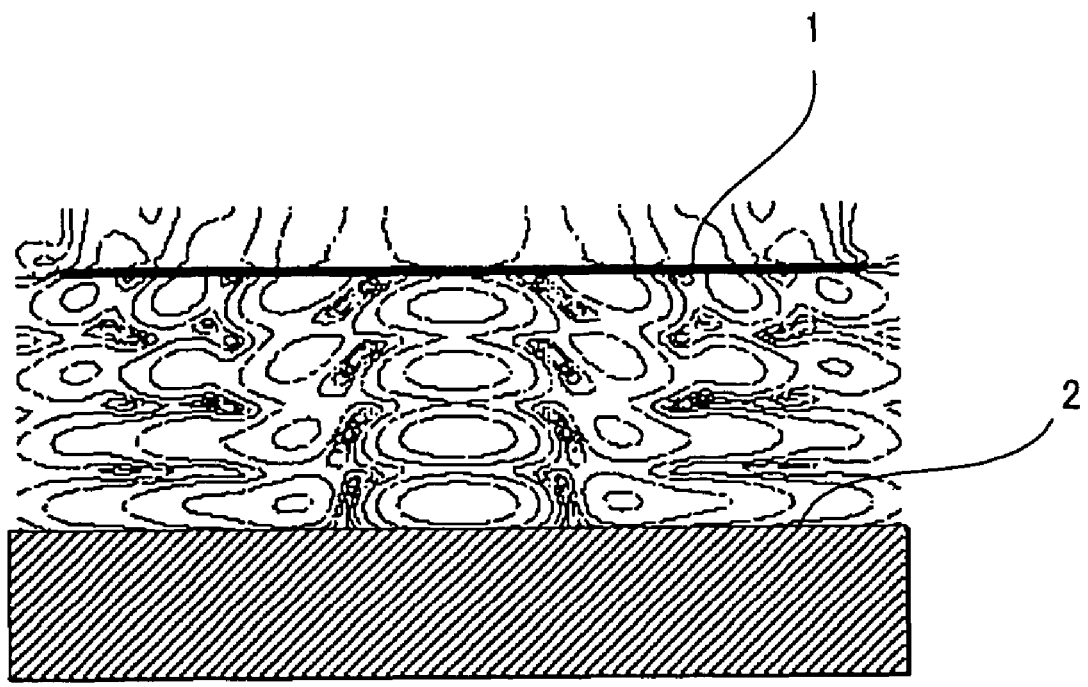
FIG. 1 shows a simulation example under a scheme of subjecting a current source Ex to forced vibration.
Figure 2:
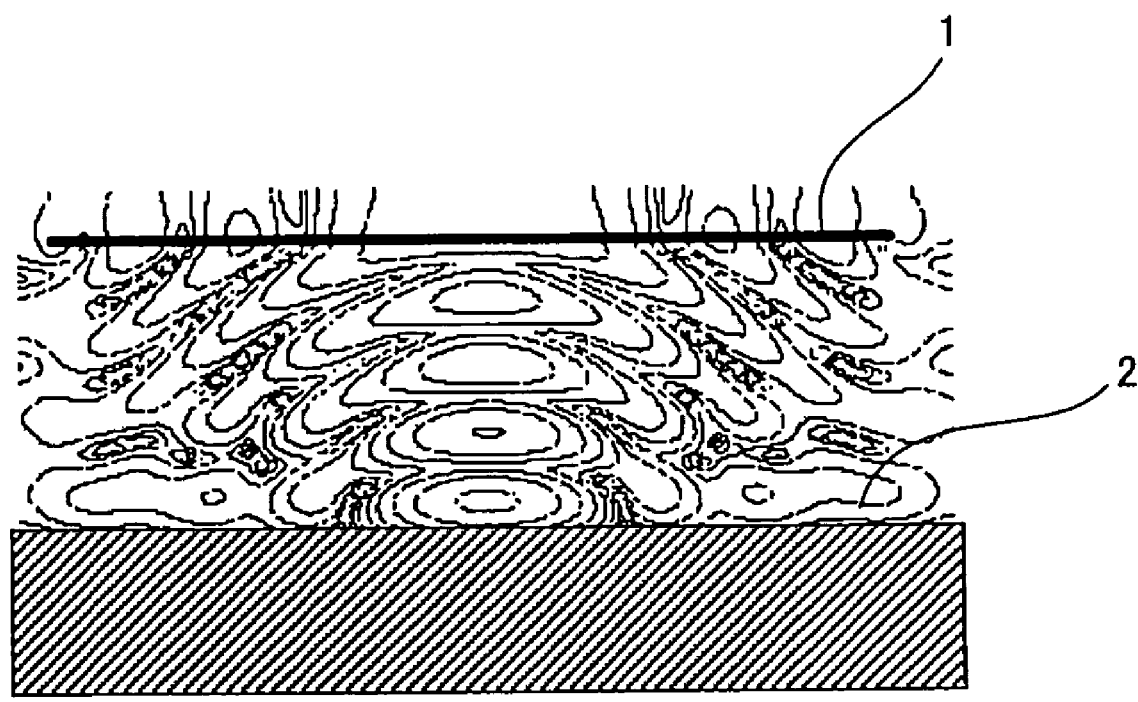
FIG. 2 shows a simulation example with consideration given to light propagation in a wave source.
Figure 3:
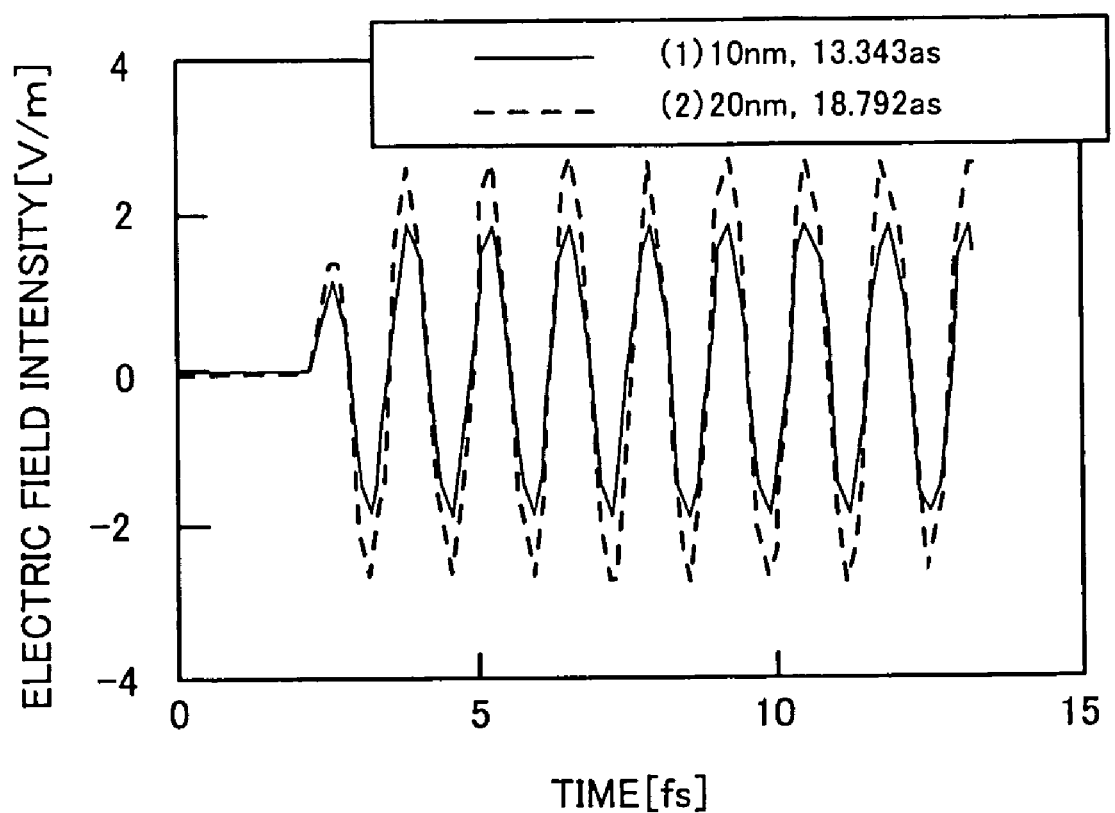
FIG. 3 shows a simulation example for confirming intensity of incident light.
Figure 12:
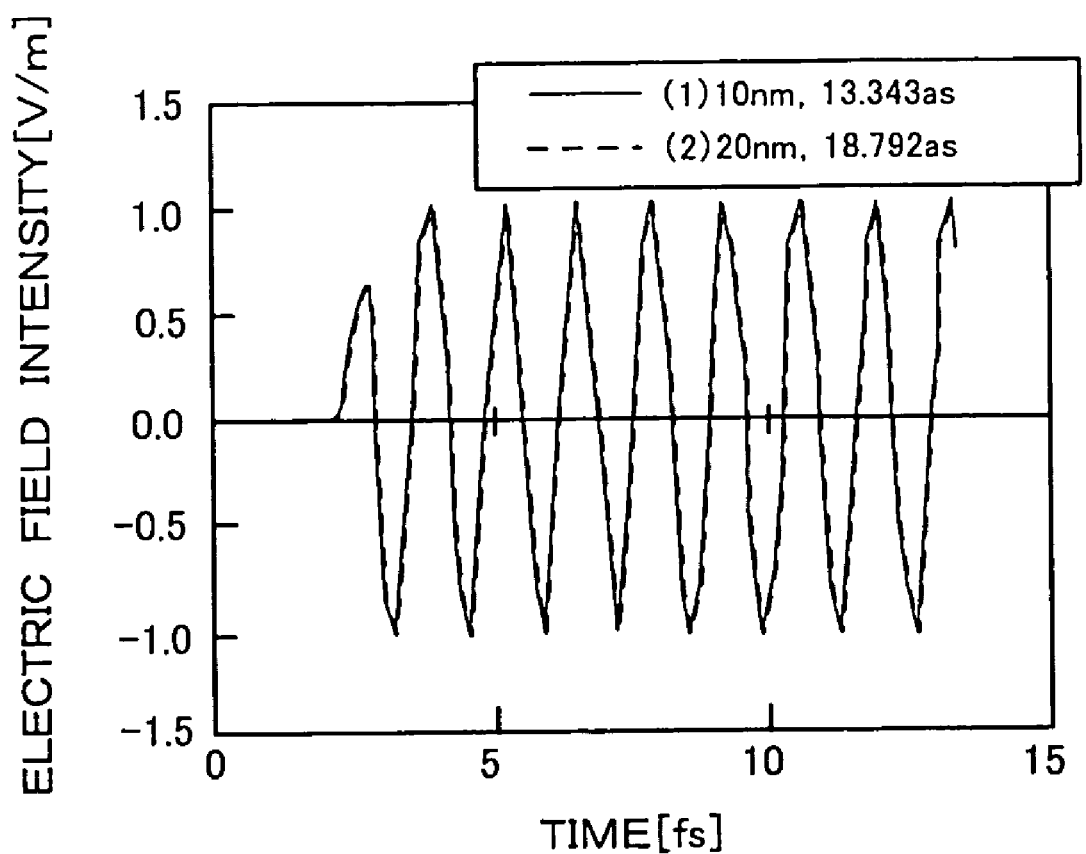
FIG. 12 shows a result when the simulation example shown in FIG. 3 is applied to this embodiment.

FIG. 12 shows the result of the simulation example shown in FIG. 3 applied to this embodiment.

As described above, in this simulation, electric field vibration of light propagating through a medium having a refractive index of 1.5 is simulated in the case where the electric field of the incident wave of the wave source is subjected to vibration using a sine wave having an amplitude of 1 V/m. Furthermore, a first condition under which the size of grids in the light propagation direction is set to 10 nm and time step is set to 13.343 as and a second condition under which the size of grids is set to 20 nm and time step is set to 18.792 as are used as calculation conditions. Assuming that the velocity of light in vacuum is $c=2.9979 \times 10^8$ [m/s], the correction coefficient value under the respective conditions is 0.53351 under the first condition and 0.37558 under the second condition. In the simulation results using these correction coefficient values, waveforms having similar amplitudes are obtained in any calculation conditions as shown in FIG. 12, and propagation light having the same amplitude as the amplitude of 1 V/m set by the wave source is correctly reproduced.

Figure 4:
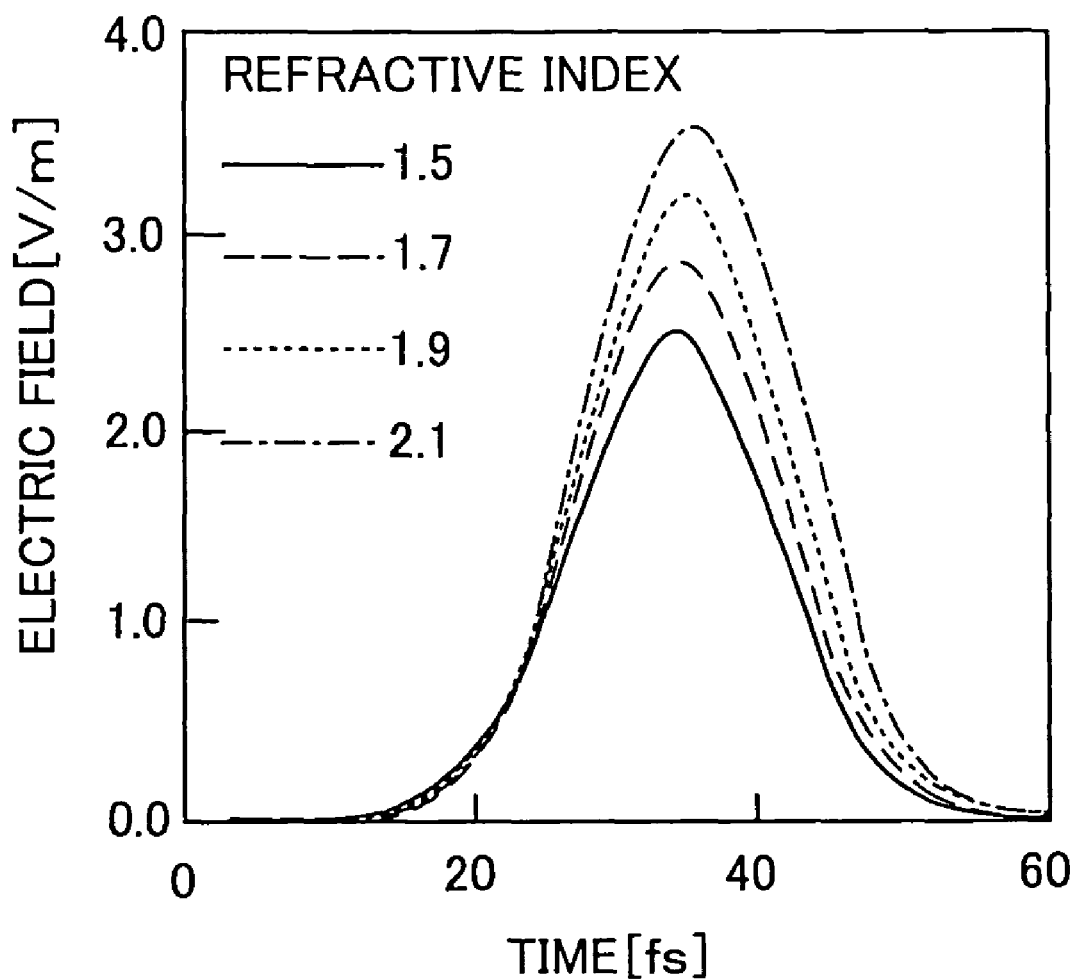
FIG. 4 shows another example of simulation for confirming intensity of incident light.
Figure 13:
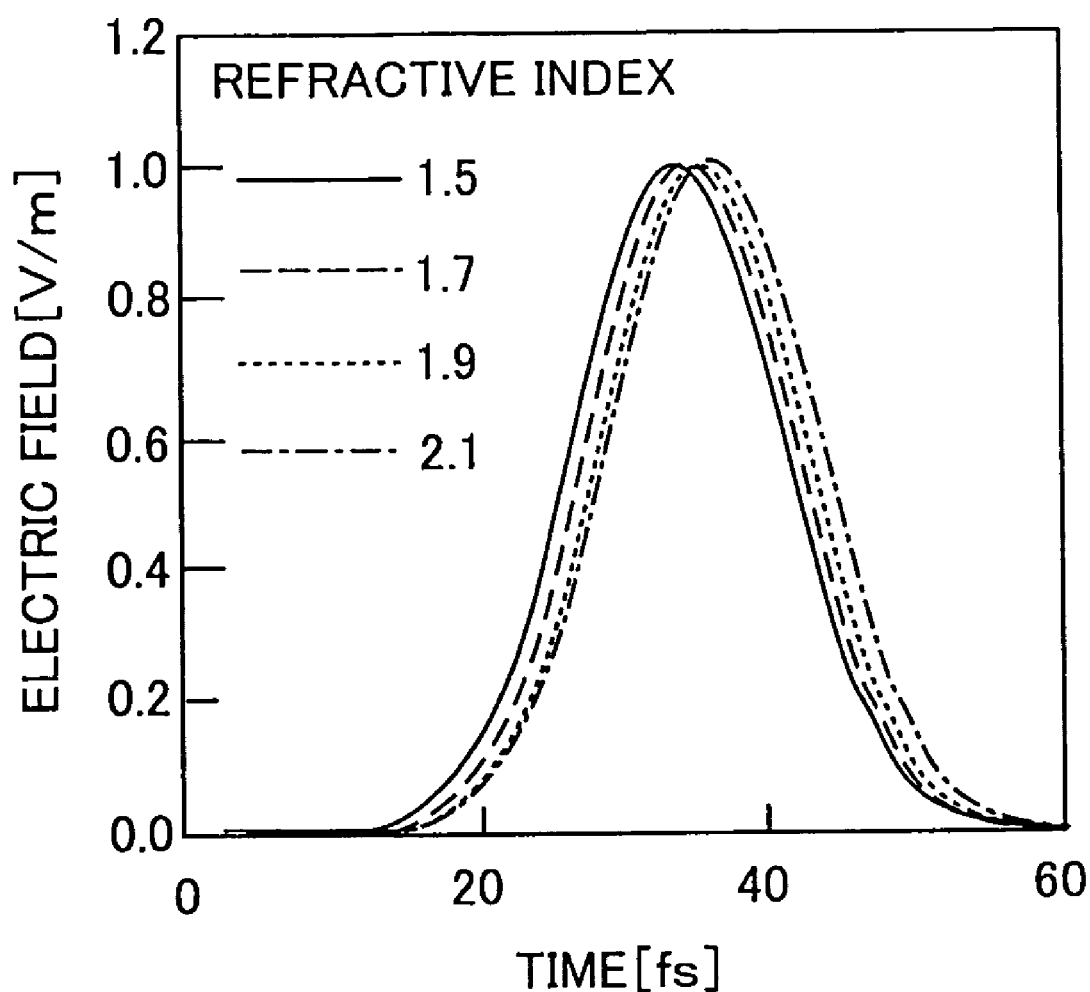
FIG. 13 shows a result when the simulation example shown in FIG. 4 is applied to this embodiment.

FIG. 13 shows results when the simulation example shown in FIG. 4 is applied to this embodiment.

As described above, in this simulation, a peak electric field of 1 V/m as the electric field of an incident wave and a Gaussian pulse having a pulse width of 16.7 ns are set and electric field vibration of propagating light is simulated for each of four different types of refractive index of the wave source. Furthermore, the grid size and space step in each of those four types are commonly set to 10 nm and 10 as respectively.

The correction coefficient in this case is a value which varies depending on the refractive index, a correction coefficient in accordance with each refractive index is applied and in this way, an analysis result that the amplitudes are set to the same value of 1 V/m for all of the four types is obtained as shown in FIG. 13.

As shown above, the calculation formula of the correction coefficients is applicable irrespective of the wave source characteristic and applicable not only to a sine wave but also to arbitrary waveforms.

Figure 14:
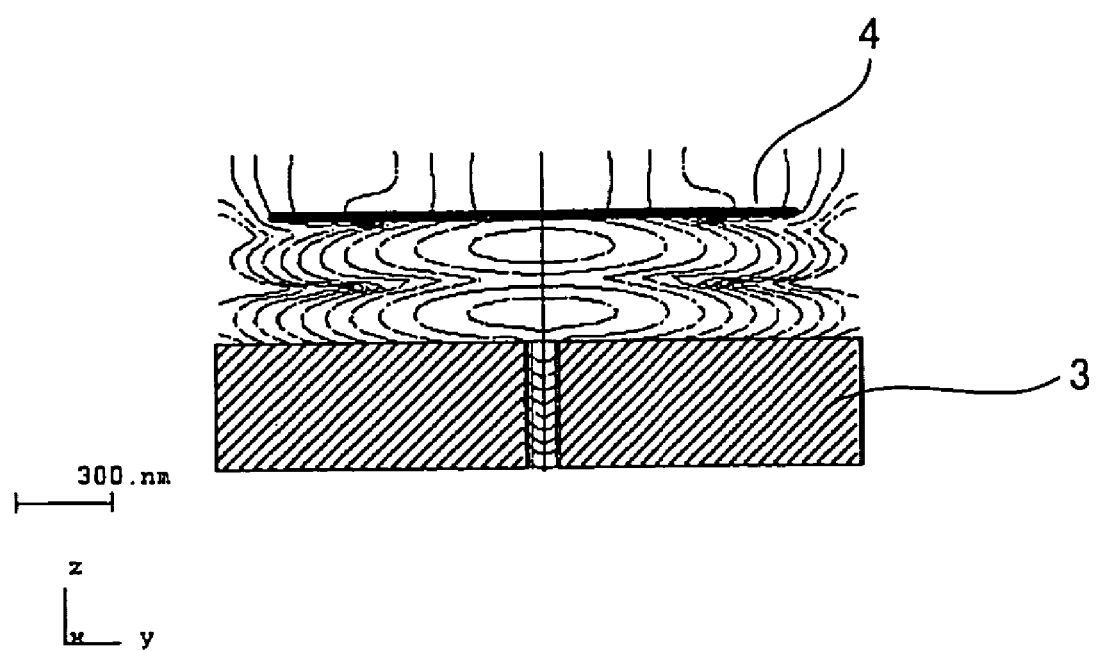
FIG. 14 shows a simulation example for a model of a gold thin film having a thickness of 400 nm with a micro circular aperture having a diameter of 100 nm.
Figure 15:
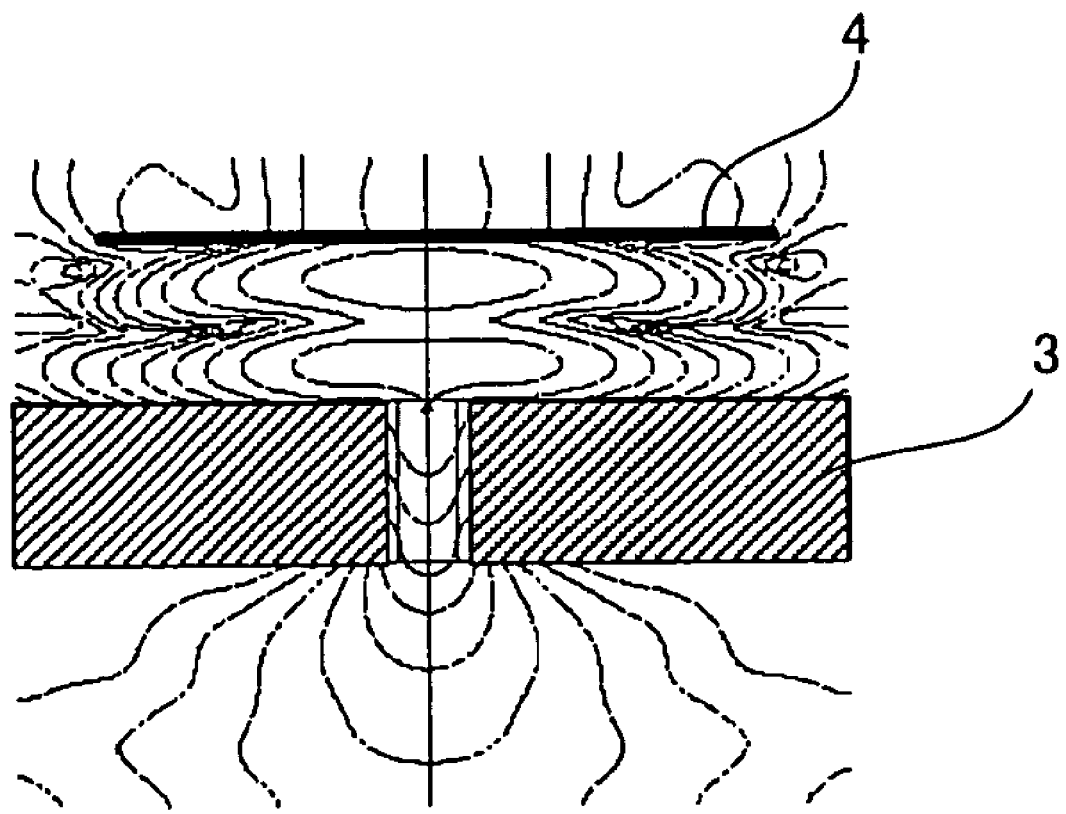
FIG. 15 shows a simulation example for a model of a gold thin film having a thickness of 400 nm with a micro circular aperture having a diameter of 200 nm.

FIG. 14 and FIG. 15 show simulation examples of a model of a gold thin film having a thickness of 400 nm with a micro circular aperture and the circular aperture has a diameter of 100 nm in FIG. 14 and 200 nm in FIG. 15.

Simulations are conducted for both FIG. 14 and FIG. 15 in the case where a plane wave having a wavelength of 405 nm is introduced from the wave source 4 above the metal film 3. In both cases, the refractive indices at the position of the wave source 4 are the same and grid sizes are also commonly set to 20 nm in the light propagation direction. However, the grid size in the in-plane direction of the thin film 3 is adjusted to the size of the aperture and set to 2 nm for the model with the aperture having a diameter of 100 nm and 5 nm for the model with the aperture having a diameter of 200 nm.

Furthermore, with regard to the time step, it is necessary to satisfy a relationship called a "CFL (Courant, Friedrich and Lavy) condition" or "Courant condition" between a minimum interval of the space grid and time step and unless the time step is a sufficiently small step with respect to the minimum interval of the space grid, calculated values according to the FDTD method diverge, preventing normal calculations. For this reason, since the grid size in the in-plane direction is 2 nm in the model having an aperture diameter of 100 nm shown in FIG. 14, the time step needs to be 4.71 as or below, and since the grid size in the in-plane direction is 5 nm in the model having an aperture diameter of 200 nm, the time step needs to be 11.6 as or below. Furthermore, for convenience of simulation, the cycle of light is preferably set to an integer multiple of the time step and the time step is preferably longer in order to shorten the calculation time. For this reason, the time step is set to 4.61 as (1/293 cycle) in the model with the aperture having a diameter of 100 nm with respect to a cycle of light of 1351 fs, while the time step is set to 11.35 as (1/119 cycle) in the model with the aperture having a diameter of 200 nm.

The analysis results of the simulations corresponding to these two models are compared.

Figure 16:
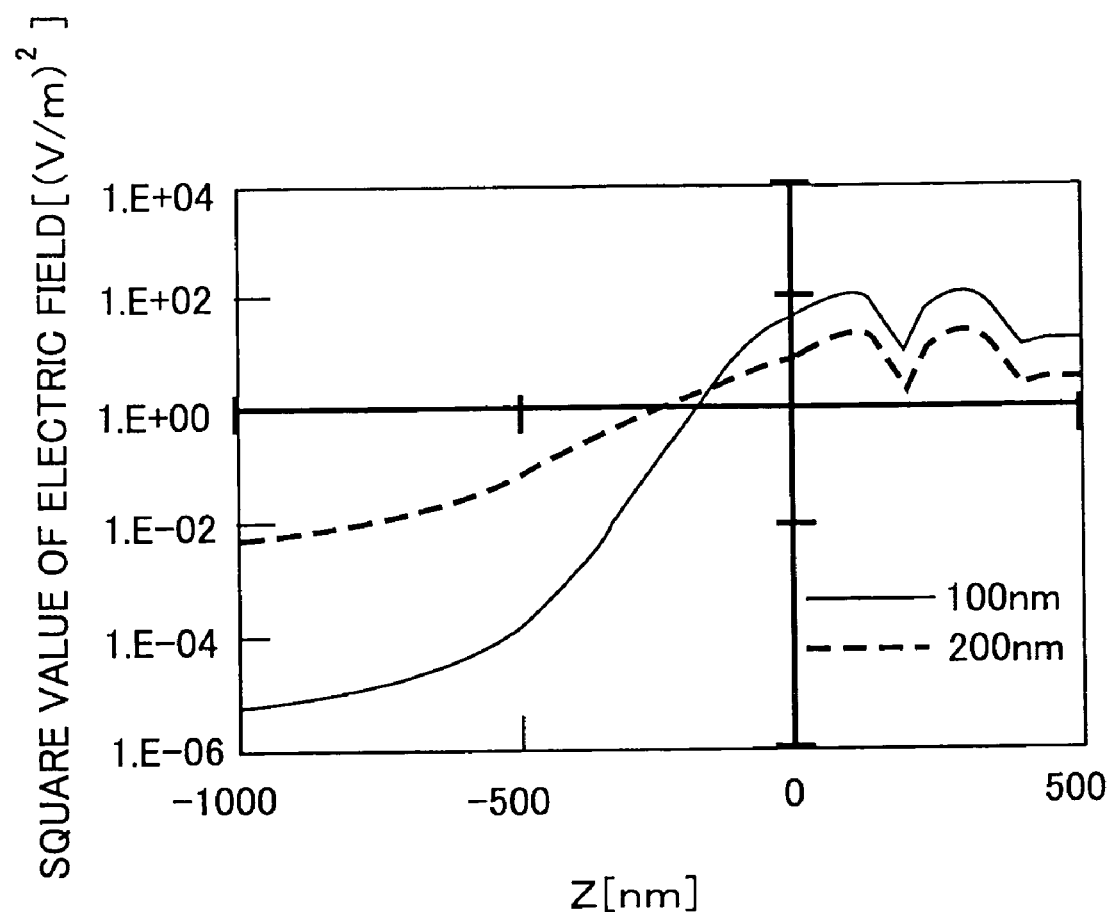
FIG. 16 shows a comparison of analysis results when the two models are simulated using a conventional simulation technique.

FIG. 16 shows the result of a comparison of analysis results of the two models which have been simulated using a conventional simulation technique.

This figure shows a graph obtained by plotting square values of the entire electric field at respective points along the center of the aperture in the light propagation direction as the analysis result. The horizontal axis of this graph shows coordinates in the light propagation direction, the wave source is located at a position of z=+400 nm and the thin film is located at a position of z=0 to −400 nm. Light is propagating from the +Z direction to the −Z direction.

Since the square value of the electric field is proportional to intensity of light, a situation in which intensity of light passing through the aperture varies depending on the aperture diameter must be originally appreciated from this graph. However, in the example shown in FIG. 16, intensity of the light propagating from the wave source to the thin film (light with z=0 to +400 nm) varies between the two models, and therefore it is meaningless to compare intensity of the light passing through the aperture.

For an accurate comparison, an analysis should be conducted using the same time step for the two models and under the same calculation condition. With the model with the aperture having a diameter of 200 nm, a calculation is performed at ½ of the time step restricted by the CFL condition and the calculation time approximately doubles. Moreover, in the case where an analysis result in the model with the aperture having a diameter of 200 nm is obtained first and then the model with the aperture having a diameter of 100 nm needs to be calculated, it is not possible to calculate the model with the aperture having a diameter of 100 nm at the same time step as that of the model with the aperture having a diameter of 200 nm (CFL condition is not met), and therefore the model with the aperture having a diameter of 200 nm should be recalculated.

Figure 17:
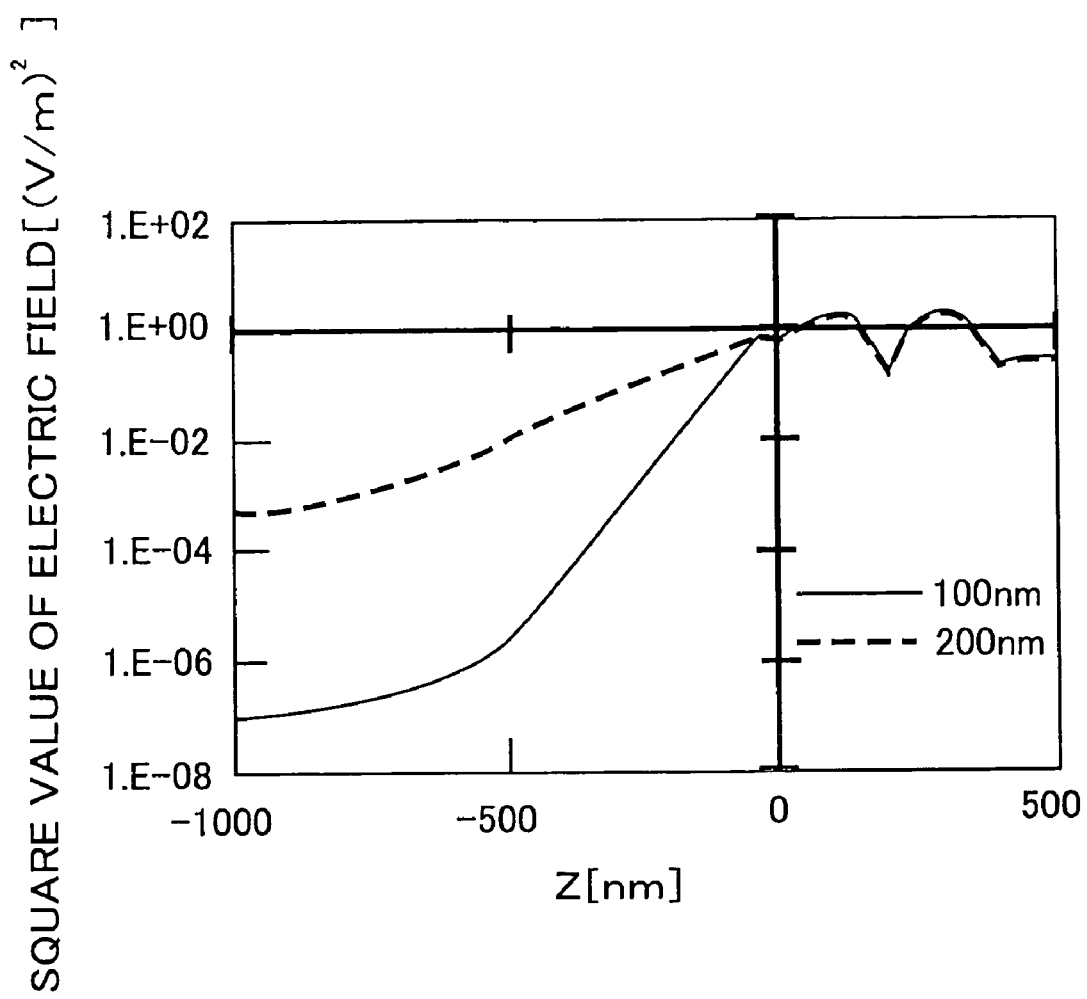
FIG. 17 shows a comparison of analysis results when the two models are simulated using the electromagnetic field simulator according to this embodiment.

FIG. 17 shows a comparison of analysis results when the two models are simulated using the electromagnetic field simulator of this embodiment.

Since the electric field amplitude is corrected with the correction coefficient, it is appreciated from this FIG. 17 that the two models show substantially the same intensity of light in the +Z domain before entering the thin film. Therefore, using the analysis result by the simulation using the electromagnetic field simulator according to this embodiment, it is possible to accurately compare attenuation after light enters the circular aperture of the thin film between the two models having different calculation conditions. Furthermore, even when a model other than these two models is added later and a calculation is performed, it is possible to make an accurate comparison.

In this way, even when the calculation condition differs, it is possible to make an accurate comparison, and therefore for calculation in each model a calculation condition appropriate to each model can be used and the efficiency of calculation time or the like can be improved.

Note that while it is possible to correct the simulation result in the case of the simple model as shown in this specification, in the case where there is non-linearity in a dielectric constant or the like, amplitude correction before simulation is indispensable.

In the explanation of the embodiment of the electromagnetic field simulation program of the present invention, an example has been shown in which elements for making up the embodiment of the electromagnetic field simulator of the present invention is constructed on a computer, but the electromagnetic field simulator of the present invention may also include elements made up of hardware.

In the explanation, an example has been shown in which the amplitudes of the electric field components are corrected, but the amplitude calculation section described in the present invention may also be one that calculates amplitude of the magnetic component after the correction.

What is claimed is:

1. An electromagnetic field simulation program storage medium that stores an electromagnetic field simulation program which when executed on a computer, causes the computer to perform a method of iteratively calculating a spatial distribution of an electromagnetic field in each different time using a spatial distribution of the electromagnetic field at a known time, the method comprising:
    setting a space grid and a time step to be used in the iterative calculation of the electromagnetic field;
    setting coefficients of equations at various positions in a space targeted for iterative calculation, based on electromagnetic physical properties;
    setting a position and a first amplitude of a wave source of the electromagnetic field as a boundary condition with respect to a spatial distribution of the electromagnetic field;
    calculating a second amplitude of an electromagnetic field component to be applied to the position of the wave source during the iterative calculation, before the iterative calculation is executed, based on the space grid and the time step and the electromagnetic physical properties, so that at the position of the wave source, the first amplitude is reproduced as results of the iterative calculation; and
    executing the iterative calculation while applying a sum of the electromagnetic field component of the second amplitude and an electromagnetic field component propagating from outside the source, to the position of the wave source.

2. The electromagnetic field simulation program storage medium according to claim 1, wherein the second amplitude $E0'$ is calculated based on the first amplitude $E0$, the dielectric constant $\in$ and the magnetic permeability $\mu$ that are set at the position of the wave source, and the time step $\Delta t$ and a width $\delta z$ of the space grid in a direction in which the electromagnetic field component of the second amplitude propagates, as:

$$E0' = 2\Delta t E0 / \{\delta z \sqrt{(\in \mu)}\}.$$

* * * * *